United States Patent [19]

Anderson

[11] Patent Number: 4,551,704
[45] Date of Patent: Nov. 5, 1985

[54] LOOK-BACK ANALOG TO DIGITAL CONVERTER

[75] Inventor: Carl J. Anderson, Peekskill, N.Y.

[73] Assignee: International Business Machines Corporation, Armonk, N.Y.

[21] Appl. No.: 536,429

[22] Filed: Sep. 27, 1983

[51] Int. Cl.[4] .......................................... H03K 13/22
[52] U.S. Cl. ............................................. 340/347 AD
[58] Field of Search .... 340/347 AD, 347 M, 347 SH; 357/5; 307/277, 306, 352, 357, 541

[56] References Cited

U.S. PATENT DOCUMENTS

| | | | |
|---|---|---|---|
| 3,196,427 | 7/1965 | Mann et al. | 340/347 |
| 3,949,395 | 4/1976 | Klein | 340/347 |
| 3,983,419 | 9/1976 | Fang | 340/347 AD |
| 4,315,255 | 2/1982 | Harris et al. | 340/347 |
| 4,509,037 | 4/1985 | Harris | 340/347 AD |

OTHER PUBLICATIONS

Leonberger et al., "4-Bit 828-Megasample/s Electro-Optic Guided-Wave Analog-To-Digital Converter," Appl. Phys. Lett. 40(7), Apr. 1, 1982, pp. 565-568.
Evanczuk, "A-D Converter Pushes Gigabits", Electronics, Jun. 16, 1982, pp. 48, 50.
Hamilton et al., Design Limitations for Superconducting A/D Converters.
H. H. Zappe, Ultrasensitive Analog-To-Digital Converter Using Josephson Junctions, IBM Technical Disclosure Bulletin, vol. 17, No. 10, Mar. 1975, pp. 3053-3054.
Fang et al., Analog-To-Digital Converter, IBM Technical Disclosure Bulletin, vol. 17, No. 8, Jan. 1975, pp. 2476-2478.
Saul, "A Novel Approach to High Speed A-D Conversion", Electronics Industry, Feb. 1978, vol. 4, No. 2, pp. 25-27.

Primary Examiner—Vit W. Miska
Attorney, Agent, or Firm—Carl C. Kling

[57] ABSTRACT

In an analog-to-digital converter implemented in logic operating on the multiple lobes of a threshold curve, such as Josephson SQUIDs, two sampling registers are provided with sufficient offset to guarantee stability at sampling in one or the other regardless of other factors. Knowledge of bit value of the next lower bit order position permits determination of which sampling is valid. Encoder logic selects the valid sampling register retroactively.

Each sampling register bit order position has two sampling SQUIDs and latching self-gated ANDs. Bias values are provided at higher orders to increment the phase offset so as to ensure low-to-high order readout.

The lowest two bit orders may be implemented in simplified logic, effectively giving two bit order positions for logic and SQUIDs equal to that of one higher order bit position.

6 Claims, 7 Drawing Figures

BIT 0000,0001,0010,0011,0100,0101,0110,011

$2^1$ $2^2A$ $2^2B$ $2^3A$ $2^2B$

LOOK-BACK ANALOG TO DIGITAL CONVERTER

BACKGROUND OF THE INVENTION

1. Field of the Invention

This invention relates to ordered high speed digital registers, and more particularly relates to a parallel sampling technique, for an ordered register of the analog-to-digital converter type, in which the phase pattern of sampling is a function of the bit values of the respectively preceding bit order positions, so as to sample each bit at a valid phase, a phase least affected by the hash of transient noise.

2. Description of Related Art

Josephson junction devices, operating at liquid helium temperatures (4.2 K.) near absolute zero, are able to operate at very high speeds and also take advantage of superconductive signal transmission. Analog-to-digital converters fabricated from superconducting Josephson devices have been reported, using the multiple lobes of a threshold curve of a Josephson interferometer. Other technologies, such as optical interferometers, which also have threshold curves with multiple lobes, are capable of very high speed operation. At such high speeds, the switching transients inherent in the technology become the limiting factors; it is usual to wait until transients dissipate before sampling the switched position, since it is not usually possible to determine in advance which position is being switched. The ordered register is thus normally assigned a sampling cycle sufficient for all transients to dissipate, on a worst case basis or statistical worst case basis. As greater speeds are introduced, greater precision is the usual response to the requirement for accuracy and capability.

Ordered registers, such as accumulators, counters and analog-to-digital converters, tend to be deployed in applications which require very high speed operation. A gating factor in ordered registers may be the propagation of carry signals from low order to high order, and a great number of fast carry techniques have been developed to circumvent this problem by simulating carry signals where appropriate. Analog-to-digital coverters, however, have generally depended upon special codes and upon high speed circuitry for their operating speed. Gray codes, in which code techniques are used to minimize transient effects by requiring that a following value be expressed with only a single change of bit value, are an attempt to minimize the transient problem. There are a number of analog-to-digital techniques and mechanisms available in the literature and in the marketplace, but these tend to operate at speeds well within the tolerances demanded by switching transients likely to be incurred as a result of normal operation. At very high speeds, sampling is adversely affected by switching transients within the register.

Examples of the prior art are:

U.S. Pat. No. 3,196,427, Mann et al, SUPERCONDUCTIVE ANALOG TO DIGITAL CONVERTER, July 1965. Mann et al shows a superconductive analog-to-digital converter comprising superconductive gate elements, magnetically and non-conductively coupled and laid along a weighted inductance for limiting the current so as to select particular gates.

U.S. Pat. No. 3,949,395, Klein, SUCCESSIVE-APPROXIMATION ANALOG-TO-DIGITAL CONVERTER USING JOSEPHSON DEVICES, April 1976. Klein shows a successive approximation analog-to-digital converter using Josephson devices. Fixed bias currents control the effective thresholds of comparison devices.

U.S. Pat. No. 4,315,255, Harris et al., MULTIPLE-QUANTUM INTERFERENCE SUPERCONDUCTING ANALOG-TO-DIGITAL CONVERTER, February 1982. Harris et al shows the use of superconducting interferometers connected in parallel, each interferometer being identical. The coupling of the analog signal to each successive interferometer is increased in the ratio of 1:2:4:8:16:32, etc.

H. H. Zappe, ULTRASENSITIVE ANALOG-TO-DIGITAL CONVERTER USING JOSEPHSON JUNCTIONS, IBM Technical Disclosure Bulletin, Vol. 17, No. 10, March 1975, pp. 3053-3054. Zappe shows an analog-to-digital converter using weak-link superconductors in quantum interference devices. Devices J1, J2 and J4 provide voltage outputs V1, V2, V4 respectively according to the settings of the DC bias of the Josephson junctions J1, J2, J4.

Fang et al, ANALOG-TO-DIGITAL CONVERTER, IBM Technical Disclosure Bulletin, Vol. 17, No. 8, January 1975, pp. 2476-2478. Fang et al shows an analog-to-digital converter incorporating a different number of Josephson junctions shunting resistances so as to select individual resistances whenever the Josephson junctions associated with respective resistances all fire. For example, a first resistance is shunted by one Josephson junction; a second resistance is shunted by two Josephson junctions; a third resistance is shunted by four Josephson junctions, etc.

Saul, "A NOVEL APPROACH TO HIGH SPEED A-D CONVERSION, Electronics Industry," February 1978, Vol. 4, No. 2 pp. 25-77. Saul shows a parallel analog-to-digital converter implemented in large scale integration and shows techniques for increasing the resolution by using separate bias chains.

Leonberger et al, "4-BIT 828-MEGASAMPLE/S ELECTRO-OPTIC GUIDED-WAVE ANALOG-TO-DIGITAL CONVERTER," Appl. Phys. Letter 40 (8), Apr. 1, 1982, pp. 565-568. Leonberger et al shows how individual bit channels of a four-bit guided wave electro-optic analog-to-digital converter can operate with optical sample to provide complete isolation of the analog signal and the sampling command pulse.

Evanczuk, "A-D CONVERTER PUSHES GIGABITS," Electronics, June 16, 1982, pp. 48-50. Evanczuk comments on the Leonberger optical sampling techniques.

Hamilton et al. "DESIGN LIMITATIONS FOR SUPERCONDUCTING A/D CONVERTERS." Hamilton et al shows the principal of analog-to-digital conversion using superconducting quantum interference devices called SQUID. Taking advantage of the SQUID characteristic of periodic dependence of their switching thresholds on an input control current.

SUMMARY OF THE INVENTION

The invention is a look-back technique, for use in ordered registers, to achieve an increased measure of immunity from transients occurring as a result of switching during normal operations, the immunity resulting from a sampling technique in which sampling is carried out in double rail fashion at a base phase and additionally at an offset phase, and both base and offset threshold samples are latched in separate sampling registers. The pattern of decoding the sampling registers is changed as a function of the bit value of the previous bit. This technique permits a maximization of the phase distance between the actual sampling interval and the previous and subsequent switching transients, and thus permits sampling at a phase position where the transient hash is least likely to be present.

In ordered registers according to this invention, there is a base rail and an offset rail (offset in phase) to bridge the transient hash of switching. If hash is present on the base rail at sampling time of a given bit order position, the hash will have dissipated by the time the offset rail is sampled. The converse is true as well—the base rail bit order position is hash-free if there is to be hash at the offset rail.

An object of the invention is to position the sampling interval as a function of the bit value of the previous information bit, and thus to position the sampling interval remote from the switching interval at which switching actually takes place, and thus remote from the switching hash which might interfere with accurate readings.

A more specific object of the invention is to provide for random parallel data entry into dual rail ordered high-speed digital sampling registers, base register and offset register with threshold sampling in parallel at instantaneous sampling intervals and with serial readout rippling serially through the register orders, with selection of base register or offset register being made for each bit order position as a function of the bit value of the next lower order bit position so as to select the sampling interval in each bit order position which is most stable.

A feature of the invention is the use of a look-back technique, with a base phase sampling register and an offset phase sampling register offset in phase so that selection of sampling register for decoding may be made on a bit order basis according to a prediction of absence of transient hash, the prediction being derived from the bit value of the next lower order bit position.

An advantage of the look-back technique of the invention is that tolerances are relaxed; for equal quality of components used in building the circuit, greater accuracy or greater speed may be achieved.

Another advantage is that the output may be expressed directly in binary code or other desired code, without the need to resort to Gray codes to minimize the effects of transients.

A specific advantage of the invention is that the invention makes possible the sampling of each bit order position at a position in its phase pattern (which may be characterized as a central area) at which transient hash from normal switching is least likely to be present.

Another specific advantage of the invention is that internal bit order positions of the base register and offset register (positions other than the lowest orders ($2^0$, $2^1$ and highest order $2^n$) may be replicated from a single pattern in making an integrated circuit implementation.

Another specific advantage of the invention is that bit order positions $2^0$ and $2^1$ (the lowest two bit order positions) may both be implemented in logic equivalent to that of a single higher order bit position, the equivalent of getting a free bit position, resulting in doubling the sensitivity of the analog-to-digital converter.

The foregoing and other objects, features and advantages of the invention will be apparent from the more parricular description of the preferred embodiments of the invention, as illustrated in the accompanying drawings.

DESCRIPTION OF THE PREFERRED EMBODIMENT

Figure 1:
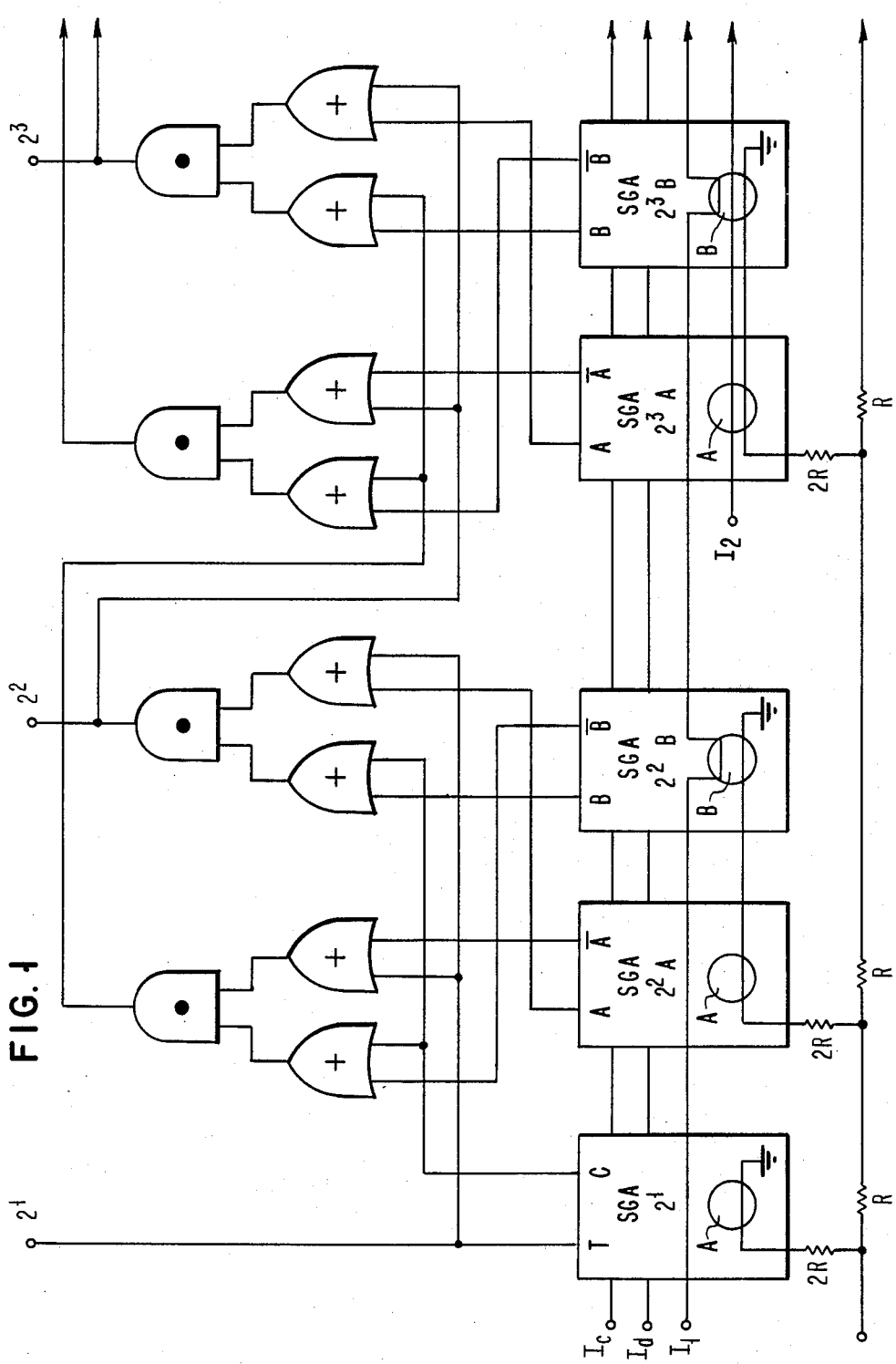
FIG. 1 is a schematic diagram of a three-position ($2^1$, $2^2$, $2^3$) preferred embodiment of the invention, a look-back analog-to-digital converter, implemented in Josephson junction technology.
Figure 4:
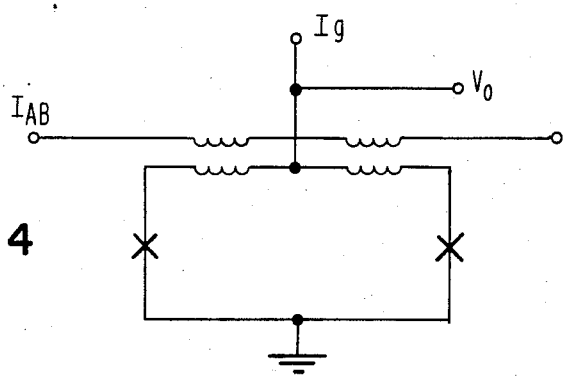
FIG. 4. is a schematic diagram of a SQUID (Superconducting Quantum Interference Device) useful in implementing the embodiment of FIG. 1.
Figure 5:
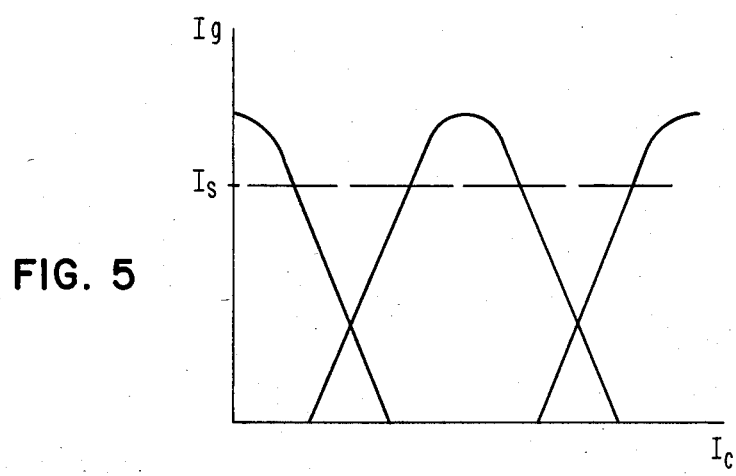
FIG. 5 is a diagram of the multiple lobes of the threshold curve of a superconducting Josephson interferometer.
Figure 6:
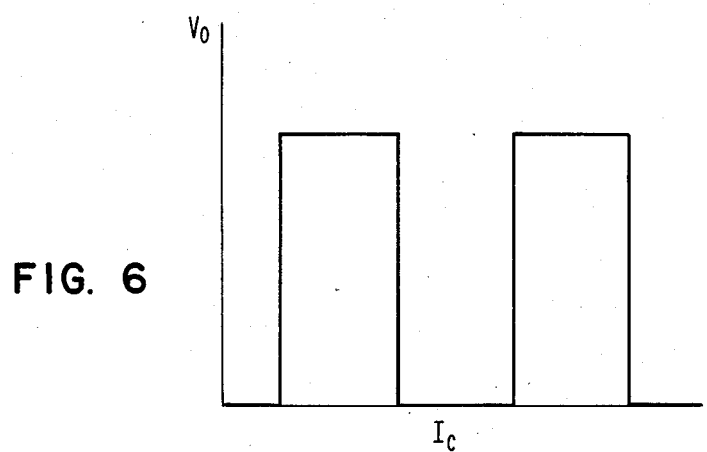
FIG. 6 is a diagram of the voltage outputs of a superconducting Josephson interferometer biased as shown by value Is in FIG. 5.

The look-back analog-to-digital (A/D) converter (See. FIG. 1) uses the multiple lobes of the threshold curve (see FIG. 5) of superconducting Josephson interferometers (see FIG. 4). A gate current is applied to each interferometer and the interferometer is coupled to the analog signal current IAB which includes a suitable bias current. As required, the interferometer provides a digital output. Several interferometers are coupled in parallel to the same analog signal current. The sampling rate is very high since the data for all bit order positions is taken in parallel, even though a single readout current passes from low order to high order in sequence. The sampling actually takes place at a point (!) on the main clock pulse (see FIG. 2) where voltage thresholds sufficient to fire the Josephson interferometer (A/D SQUID) are reached.

Ordinarily, in such an analog-to-digital converter, the phase of the output voltage lobes of each interferometer must be set very precisely with respect to the phase of the output voltage lobes of the least significant bit order interferometer. This ordinarily would require very precise setting of the gate current and the bias current for each interferometer and would also require very tight tolerances in the self inductance, the mutual inductance and the maximum zero value current Im(0). This look-back analog-to-digital converter, while using the multiple lobes of the threshold curve of an interferometer, provides more relaxed requirements on the gate current and the bias current, and on the fabrication tolerances. It provides for sampling all of the bit order positions in parallel, but utilizes the existing data values and look-back logic to select a sampling rail (base or offset) so as to be out of phase with expected transient hash, ordinarily present during operation, as values change from 1 to 0 and from 0 to 1 as a function of carries propagated from adjacent respectively lower order bit positions.

The precision to which the output voltage lobes of an interferometer in this analog-to-digital converter must be set is reduced by threshold value sampling to a double rail of two registers (base sampling register A and offset sampling register B) and encoding threshold values as a function of bit value information from the next less significant order bit position.

Figure 2:
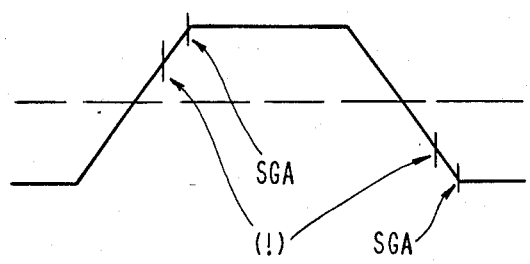
FIG. 2 is a clock pulse power supply timing diagram illustrating sampling intervals.
Figure 3:
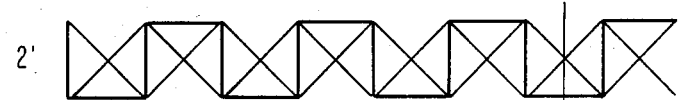
FIG. 3 is a phase graph of control currents showing how higher order bit position signals have a wider central area for sampling, and showing the effects of techniques new to this patent specification for sampling within the central area of each signal so as to minimize the likelihood of sampling the transient hash that occurs as a signal is being changed. An example, binary value 0110, (decimal 6) is illustrated by the verticle line.
Figure 3:
Figure 3:
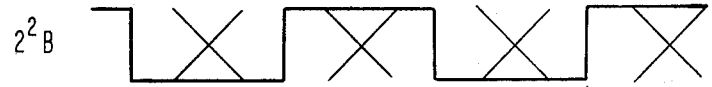
Figure 3:
Figure 3:
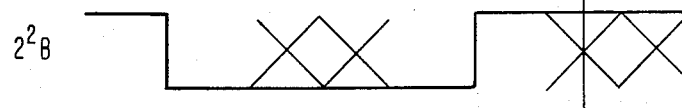

FIGS. 1-3 should be considered together in understanding the invention. FIG. 1 shows a three-position Josephson analog-to-digital converter according to the invention. FIG. 2 illustrates how main clock timing signals are derived (in Josephson latching logic) directly from the pulse power supply. The power supply may be operating at 500 MHz, with latching taking place on every half cycle, and with a very short sampling interval(!) occurring on each half cycle as the power voltage passes the bias threshold. The sampling registers latch into self-gated Josephson AND circuits during a short interval following the sampling interval (!).

Latching logic has the quality of switching when inputs are appropriate and then holding latched for the remainder of the half cycle, no matter what happens to the inputs. There is a period of possible transient hash as latching occurs; thereafter the latched devices settle down in their 0 or 1 conditions and remain stable for the remainder of the half-cycle. In an analog-to-digital converter, the bit value of the next lower order bit position helps determine whether switching is to occur or not occur, in a fashion analogous to carries in a binary counter.

The bit value of the next lower order bit position thus can be used to predict stability (or hash) in a bit order position as the "carry" occurs.

FIG. 3 shows how the prediction of stability or hash, taken as a function of the bit values of respectively preceding bit order positions, is used in the look-back analog-to-digital converter, according to this patent specification, to achieve very high speed sampling during stable periods of the Josephson latches. It avoids transient hash. Sampling occurs at such high speed that it can be easily completed during the stable periods. The problem is that the stable period is data sensitive. It is a function of the bit value of the next preceding bit order position.

According to this patent specification, there is a double rail of two sampling registers, base sampling register A and offset sampling register B, each sampling register containing sufficient bit order positions to monitor a complete set of analog signal thresholds digitally. The base sampling register is sampled at a base phase, and the offset sampling register is sampled at an offset phase (offset 90°). All positions of each sampling register are sampled in parallel and the results are latched. Output encoder logic, responsive to the bit values in the sampling registers, and also responsive to the bit values in the registers' respectively lower order bit positions, is scanned serially by a current ripple scan at electrical pulse (speed of light) speed. This serial scan selects the output (for each bit order position) selectively from the latched base sampling register A or from the latched offset sampling register B, depending upon the bit value of the respective next lower order bit position. Since the validity of the value in a given bit order position is a function of the possibility of carry from the next lower order, and since this possibility is known from the lower order bit value, and since the transient hash lasts less than 90° of phase, it is possible rigorously to predict stability in either the base sampling register A or the offset sampling register B (sometimes both) for a given bit order position other than the lowest base bit order position. If stability is known to have existed at base phase, or known to have existed at offset phase, the sampling result already latched is selected accordingly from the base sampling register A or from the offset sampling register B.

Restated, the two sampling registers are sampled with sufficient offset to guarantee stability at sampling in one or the other regardless of other factors. Knowledge of bit value of the next lower bit order position permits determination of which sampling is valid. Encoder logic selects the valid sampling register retroactively.

FIG. 3 is a phase graph showing output signals (voltages) vs. total control current over a range equivalent to that of the embodiment shown in FIG. 1 (three bit order positions $2^1$, $2^2$, $2^3$ of conversion capability). The digital output value varies as a function of the control current (analog input) of the interferometers.

Each bit order position, except the lowest two bit order positions to be digitized, requires two interferometers (see FIG. 1), a base interferometer D/A SQUID and an offset interferometer. (The offset in the preferred embodiment is 90°). The phase of the output voltage of the base interferometer is set at $-((2^{n-2}-1)/2^n) \times 180°$ where n is the bit position number (the numbering starts with the least significant bit position being bit position 1; and the phase of bits 1 and 2 is 0). The base interferometer operates at 0 phase, and the phase of the offset interferometer's output voltage lobes is set at 90°/2 with respect to the phase of the base interferometer. In FIG. 1, the base interferometer A is shown associated with a self-gated latching Josephson AND circuit marked SGA $2^m$A and the offset interferometer B is shown associated similarly with SGA $2^m$B. Thresholds are provided by a standard resistance network as is known in the art.

In FIG. 3, columns marked X show the interferometers, base A or offset B, that are selected to digitize signal values 0-7 as binary values 0000-0111. No X that appears in FIG. 3 is closer in phase than 45°/4 to a transition in the output function (except for the base low order bit position row $2^1$). Except for the base low order bit position, the latched interferometer output (base A or offset B) selected for encoding the digital output of a bit order position is determined by the value of the respective next less significant bit position. If the next less significant bit order position value is 0, the base interferometer A provides the output of the bit order position, since there are no lower order bit positions to provide carry signals. It will be 0 or 1, reflecting inputs from theshold sampling into the base register A. If the next less significant bit order position value is (1), there is a possibility of resulting hash and the offset interferometer B provides the output of the bit order position.

The circuit of FIG. 1 implements the values of FIG. 3 in its internal bit order positions $2^1 - 2^m$, with values 000XXX as shown (m=3 for the bits shown) in FIG. 1. End positions (not shown) should be equipped to deal with special requirements of end positions; these will be described in passing, and will be described in detail later as required. Internal bit order positions $2^1$ to $2^{(m-1)}$ are similar to each other, and differ only slightly from the end positions. The actual values assigned to the various bit order positions may be varied to suit the needs of the application, but for clarity these values are assigned a simple binary progression, low order to high order. These threshold differences, related to the net resistance of the series-parallel resistance network in advance of its position, provide the binary value coding to the converter. Other codings might be arranged according to techniques well known in the art.

Figure 7:
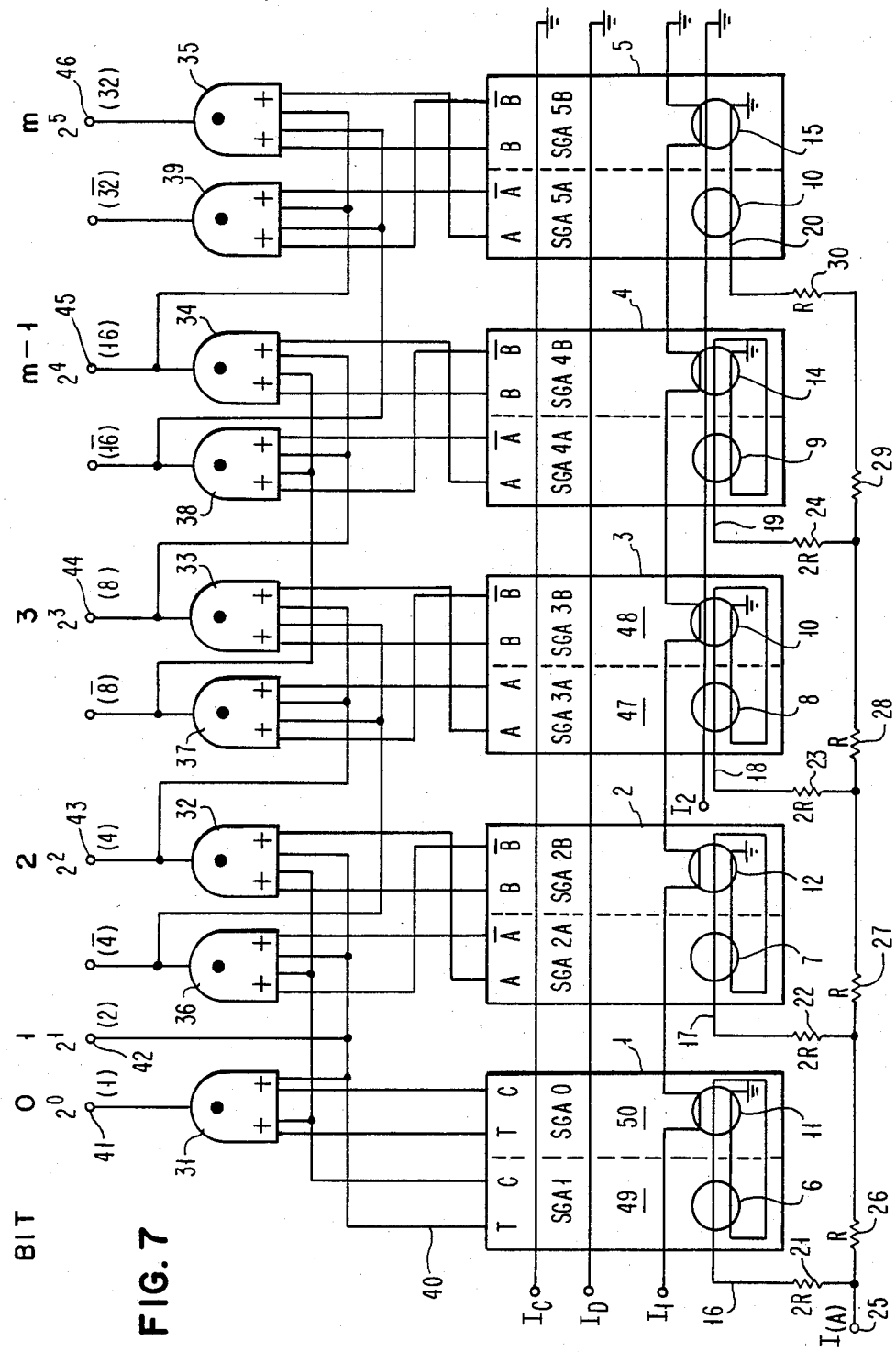
FIG. 7 is a diagrammatic extension of the preferred embodiment illustrated in FIG. 1, including additional high order bit positions $2^{m-1}$ and $2^m$ (where as illustrated m=5) and including additional extra-low order bit position $2^0$.

FIG. 7 shows end positions as well as internal bit positions. Base SGA's 1, 2A, 3A, 4A and 5A provide true and complement outputs in response to the combined values of analog input at terminal 25 and bias input $I_2$ where applied. The offset SGA's 0, 2B, 3B, 4B and 5B provide true and complement outputs in response to the combined values of analog input terminal 25 and bias inputs $I_1$ and $I_2$ (where applied). Bias input $I_1$ shifts the phase of the offset SGA's output by 90°. Bias input $I_2$ shifts the phase of the SGA's output by $((2^{n-2}-1)/2^n) \times 180°$ where n is the bit order position. For n=0, 1, and 2 the phase shift is 0. For n>2, the phase shift is different for each higher order bit. The coupling inductance of bias input $I_2$ to the SGA's is physically set to give the proper phase shift for each bit in accordance with the formula response to the combined values of analog input at terminal 25 and DC bias input $I_1$. In the FIG. 7 embodiment, n=3 and the offset increment sample interval phase is 22.5° in phase. Additional phase increments are added at higher order positions to a limit of 45°.

Each bit order position 1-5 includes a set of interferometer SQUIDs (6-15) and a set of two Josephson self-gated AND latches, the related parts of voltage divider network 16-30 and also includes a set of two (one for the low bit order position current injection Josephson OR-AND circuits (31-35 for providing bit value true outputs) and (36-39 for complements). The true and complement OR-AND's 31-37 provide bit value data (look-back) function of this invention. The true output OR-AND circuits (31-35) provide digital conversion true outputs for use by a utilization device not shown. Digital conversion complement outputs may be derived from look-back OR-AND circuits 36-39 and from a direct connection to the complement output of Josephson self-gated AND circuit 1 SGA-A for the low-end position (not shown) as desired.

FIG. 7 shows detail, as contrasted to FIG. 1, extended downward one bit position (an extra offset bit position assigned binary value $2^0$) and upward two bit positions $2^{(m-1)}$ and $2^m$. In this FIG, m=5.

The self-gated AND latches in registers 1-5 respond to appropriate analog input signals detected by the respective SQUIDs 6-15 by providing latched true and complement values necessary to digital conversion. Details of operation may be found in such publications as Spargo et al, "A PIPELINED GRAY CODE-TO-NATURAL BINARY DECODER FOR USE IN A JOSEPHSON A/D CONVERTER," IEEE Transactions on Magnetics, Vol. Mag.-19, No. 3, May 1983, pp. 1255-1258.

TABLE 1

TRUTH TABLE FOR AN INTERNAL BIT ORDER POSITION (m)

| Inputs | | Outputs | |
|---|---|---|---|
| Interferometers | | Inputs from next less significant order bit position True | A/D Result and output to next more significant order bit position True |
| A Base | B Offset | | |
| 0 | 1 | 0 | 0 |
| 0 | 1 | 1 | 1 |
| 1 | 0 | 0 | 1 |
| 1 | 0 | 1 | 0 |
| 1 | 1 | 0 | 1 |
| 1 | 1 | 1 | 1 |
| 0 | 0 | 0 | 0 |
| 0 | 0 | 1 | 0 |

The inputs to Table 1 are the base and offset interferometer threshold sampling results for the given bit positions, and values from the respective next less significant bit order positions. The analog-to-digital conversion result outputs of the truth table are also supplied to the respective next more significant order bit positions. The truth table is implemented in all internal orders in the A/D converter shown in FIGS. 1 and 7. The end position at the low end does not have actual inputs from the next less significant order bit position.

The look-back analog-to-digital converter works as follows:

A gate current pulse goes to all the threshold sampling in parallel (a delay in some of the gate currents might be used to compensate for the velocity of the signal which goes over all the interferometers in series). A signal propagates along the look-back logic chain, determining the A/D output for each bit order position in series. Note that this is a series ripple at very high speed.

The sensitivity of the analog-to-digital converter is increased by a factor of two (the same as adding one bit to the output) by using two interferometers for both the $2^0$ and $2^1$ bit order positions. The offset interferometer is 90° out of phase with the base interferometer. Using the results from the $2^0$ offset interferometers, the output for a bit less significant than bit 1 is computed.

The look-back analog-to-digital converter samples the data for all threshold values in parallel, but analyzes the threshold values by the look-back encoder in series from the least significant bit to the most significant bit, at very high speed.

The invention has been described as embodied in low-temperature Josephson technology. Other technologies might be used, and changes within the embodiment might be expected, from those skilled in the art, without departing from the scope and spirit of the invention as pointed out in the following claims.

What is claimed is:

1. An ordered register subsystem, for a high speed data processing system, having interconnected analog input means, register/encoder means and output utilization means characterized by
(a) base sampling register means, having ordered bit positions settable to analog threshold values in response to an analog input signal, connected to the analog input means, forming part of the register-/encoder means;

(b) offset sampling register means, having ordered bit positions settable to analog threshold values in response to an analog input signal, connected to the analog input means, forming part of the register-/encoder means;

(c) base sampling interval phasing means connected to said base sampling register means in sampling control configuration;

(d) offset sampling interval phasing means, offset in phase from said base sampling interval phasing means, connected to said offset sampling register means in sampling control configuration;

(e) sample encoding means, connected to said base and offset sampling register means, responsive to threshold value settings of said base and offset sampling register means, and to its own output signals from respectively lower bit order positions, to encode in sequence, on a bit order position basis, as a function of respective next lower order bit position bit values, the respective composite values of respective next lower order bit position and of said base sampling register means, or alternatively the composite values of respective next lower order bit position and of offset sampling register means.

2. An ordered register subsystem according to claim 1 further characterized in that
the offset of said offset sample interval phasing means is approximately 90 degrees.

3. An ordered register subsystem according to claim 1 further characterized by
said offset sample interval phasing means includes offset increment sample interval phasing means, offset from said base sampling interval phasing means by an increment over the offset of said offset sampling interval phasing means, to provide additional offset to adjust sampling interval phasing additionally for higher order bit positions.

4. An ordered register subsystem according to claim 3 further characterized in that
said offset increment sample interval phasing means is phase shifted:

$$-((2^{n-2}-1)/2^n)180$$

where n is the bit order position and the phase of bit positions 1 and 2 is 0 degrees.

5. An ordered register subsystem according to claim 1 further characterized in that
said sample encoding means includes for the base low order bit position a direct connection of said base sampling register means base low order position to the output utilization means; and
said offset sampling register means includes an offset low order position, lower than said base low order bit position, and said sample encoding means includes means connecting said offset sampling register means via said sampling register encoding means to the utilization means,
whereby the implementation complexity of the base low order bit position and of the offset extra low order position together approximates the implementation complexity of internal bit order positions of the subsystem.

6. An analog to digital converter according to claim 5 further characterized in that
said base sampling register means and said offset sampling register means are implemented in latching superconductive Josephson technology, including self-gated AND circuits and SQUIDs, and said offset increment sampling interval phasing means is implemented as DC bias windings applying appropriate vias voltages to said SQUIDs.

* * * * *